(12) United States Patent
Zhu et al.

(10) Patent No.: US 10,338,155 B2
(45) Date of Patent: Jul. 2, 2019

(54) MAGNETOMETER BODY AND THREE-AXIS INDUCTION MAGNETOMETER USING THE SAME

(71) Applicant: Institute of Electronics, Chinese Academy of Sciences, Beijing (CN)

(72) Inventors: Wanhua Zhu, Beijing (CN); Bin Yan, Beijing (CN); Leisong Liu, Beijing (CN); Guangyou Fang, Beijing (CN)

(73) Assignee: INSTITUTE OF ELECTRONICS, CHINESE ACADEMY OF SCIENCES, Beijing (CN)

( * ) Notice: Subject to any disclaimer, the term of this patent is extended or adjusted under 35 U.S.C. 154(b) by 504 days.

(21) Appl. No.: 15/021,369

(22) PCT Filed: Mar. 5, 2014

(86) PCT No.: PCT/CN2014/072929
§ 371 (c)(1),
(2) Date: Mar. 11, 2016

(87) PCT Pub. No.: WO2015/035755
PCT Pub. Date: Mar. 19, 2015

(65) Prior Publication Data
US 2016/0231392 A1 Aug. 11, 2016

(30) Foreign Application Priority Data
Sep. 12, 2013 (CN) .......................... 2013 1 0415055

(51) Int. Cl.
*G01R 33/02* (2006.01)
*G01R 33/00* (2006.01)
*G01R 33/04* (2006.01)

(52) U.S. Cl.
CPC ...... *G01R 33/0041* (2013.01); *G01R 33/0011* (2013.01); *G01R 33/0206* (2013.01); *G01R 33/04* (2013.01)

(58) Field of Classification Search
CPC ............ G01R 33/0041; G01R 33/0047; G01R 33/0206
See application file for complete search history.

(56) References Cited

U.S. PATENT DOCUMENTS 5,457,383 A * 10/1995 Takahashi .......... G01R 33/0206
324/207.26
5,672,967 A 9/1997 Jensen et al.

FOREIGN PATENT DOCUMENTS

CN 102004231 A 4/2011
CN 102012491 A 4/2011
(Continued)

OTHER PUBLICATIONS

Grosz, A. et al., "Minimizing crosstalk in three-axial induction magnetometers", Review of Scientific Instruments, 81: 125106-1-125106-9 (2010).
(Continued)

*Primary Examiner* — Minh Q Phan
(74) *Attorney, Agent, or Firm* — Merchant & Gould P.C.

(57) ABSTRACT

The present disclosure provides a magnetometer body and a three-axis Induction Magnetometer (IM) using the same. The magnetometer body comprises: a magnetic core structure with an H-shaped longitudinal section, having a middle portion being an elongated rod-shaped magnetic core and two end portions being disk-shape magnetic flux concentrators; and an induction coil evenly wounded around a perimeter of the magnetic core in the magnetic core structure. In the present disclosure, disk-shape magnetic flux concentrators are fixed on two ends of the elongated magnetic core to collect magnetic flux, which is equivalent to increasing a
(Continued)

length-diameter ratio of the magnetic core, thereby breaking through a noise limit of a conventional IM in a limited space.

11 Claims, 7 Drawing Sheets

(56) References Cited

FOREIGN PATENT DOCUMENTS

| | | |
|---|---|---|
| CN | 102012492 A | 4/2011 |
| CN | 102116853 A | 7/2011 |
| CN | 102129049 A | 7/2011 |
| CN | 102147482 A | 8/2011 |
| CN | 102590767 A | 7/2012 |
| CN | 103472409 A | 12/2013 |
| WO | 2010/020648 A1 | 2/2010 |

OTHER PUBLICATIONS

Grosz, A. et al., "A Three-Axial Search Coil Magnetometer Optimized for Small Size, Lowe Power, and Low Frequencies", IEEE Sensors Journal, 11(4): 1088-1094 (2011).

Papemo, E. et al., "A miniature and ultralow power search coil optimized for a 20 mHz to 2 kHz frequency range", Journal of Applied Physics, 105: 07E708-1-07E708-3 (2009).

Papemo, E. et al., "Compensation of Crosstalk in Three-Axial Induction Magnetometers", IEEE Transactions on Instrumentation and Measurement, 1-7 (2011).

International Search Report for corresponding International Patent Application No. PCT/CN2014/072929 dated Jun. 19, 2014.

\* cited by examiner

MAGNETOMETER BODY AND THREE-AXIS INDUCTION MAGNETOMETER USING THE SAME

This application is a National Stage Application of PCT/CN2014/072929, filed 5 Mar. 2014, which claims benefit of Ser. No. 201310415055.4, filed 12 Sep. 2013 in China and which applications are incorporated herein by reference. To the extent appropriate, a claim of priority is made to each of the above disclosed applications.

TECHNICAL FIELD

The present disclosure relates to the technical field of sensor technology, and more particularly, to a magnetometer body and a three-axis Induction Magnetometer (IM) using the same.

BACKGROUND

In the field of marine science observation, observing and researching on spatial and temporal distribution rules of marine geomagnetism is one of basic contents for marine science observation. A high-sensitivity IM is an essential tool for this scientific activity. Information of variation in a natural magnetic field in a range of 0.1 mHz-100 Hz may be accurately acquired by using the high-sensitivity IM. The information in the band is of very important reference value for research on geosciences such as a submarine geological structure, plate tectonic movement or the like.

With the rise of deep water oil and gas exploration, the marine electromagnetic method has become one of the important means for marine oil and gas exploration. The practice of marine oil and gas exploration at home and abroad shows that the marine electromagnetic method greatly improves the drilling success rate and effectively reduces the cost of marine oil exploration and exploitation by identifying resistivity of target geological bodies. Almost all marine electromagnetic instruments measure a magnetic field component by using an IM, for example, marine electromagnetic instruments from corporations such as the SIO Research Institute, Schlumberger in the United States or the like.

Thus, no matter whether in the field of marine science observation or in the field of marine resources and energy sources, IMs are an indispensable core technology, which directly restricts the development of marine electromagnetic instruments. Normally, a sensitivity of an IM is in a range of $10^{-4}$ nT/$\sqrt{Hz}$-$10^{-3}$ nT/$\sqrt{Hz}$ (at 1 Hz). The existing IMs comprise the MTC-80 magnetometer and MTC-50 magnetometer from the PHOENIX Geophysics Limited corporation in Canada, the MFS-06(e) magnetometer and MFS-07 magnetometer from the Metronix Geophysics Corporation in German or the like.

These magnetometers have a length in a range of 1 m-1.4 m, a diameter of about 10 cm, and a mass in a range of 8 kg-12 kg. In the process of marine surveillance, three magnetometers are required to be sealed respectively by a long cylindrical pressure cabin and dipped into the bottom of the sea, and a signal is transmitted to a receiver inside an instrument housing via a waterproof cable. The entire IM has a volume exceeding 1 $m^3$, and a weight greater than 400 kg. Further, 4-5 deep sea instrument housings are needed to ensure enough buoyancy. Disadvantageously, the excessively large volume and excessively high cost of the magnetometer have brought great challenges to the exploration operation. However, if the volume of the magnetometer is reduced, the sensitivity may be correspondingly reduced, and an equivalent input noise may be increased, which cannot meet the requirements for the measurement accuracy in the field of marine science observation or in field of marine resources and energy sources.

SUMMARY

I. Technical Problem to be Solved

In view of the above technical problems, the present disclosure provides a magnetometer body and a three-axis Induction Magnetometer (IM) using the same, to achieve minimization of the three-axis IM on the premise of ensuring measurement accuracy.

II. Technical Solutions

According to an aspect of the present disclosure, a magnetometer body is provided. The magnetometer body comprises a magnetic core structure with an H-shaped longitudinal section, having an middle portion being an elongated rod-shaped magnetic core and two end portions being disk-shape magnetic flux concentrators; and an induction coil evenly wounded around a perimeter of the magnetic core in the magnetic core structure.

According to an aspect of the present disclosure, a three-axis IM is further provided. The three-axis IM comprises a sensor body module comprising three magnetometer bodies described above, wherein directions of magnetic cores of any two of the three magnetometer bodies are perpendicular to each other; and three chopper amplifier circuits for enhancing amplitude of signals output by the induction coils in the three magnetometer bodies through chopper amplification.

III. Beneficial Effects

It can be seen from the above technical solutions that the magnetometer body and the three-axis IM using the same of the present disclosure achieve the following beneficial effects:

(1) In the magnetometer body, disk-shape magnetic flux concentrators are fixed on two ends of the original elongated rod-shaped magnetic core to collect magnetic flux, which is equivalent to increasing a length-diameter ratio of the magnetic core, thereby breaking through a noise limit of a conventional IM in a limited space; and (2) In chopper amplifier circuits of the three-axis IM, crosstalk signals among signals in three axes are minimized by a signal compensation module, thereby improving the measurement accuracy of the magnetic field.

DETAILED DESCRIPTION

In order to make the purpose, technical solutions, and advantages of the present disclosure more clear and obvious, the present disclosure will be further described in detail below in conjunction with specific embodiments and with reference to drawings. It should be illustrated that in the drawings or the description of the specification, the same reference numbers are used for similar or identical parts. Implementations which are not illustrated or described in the drawings are well-known forms for an ordinary person in the art. In addition, although examples of parameters including specific values may be provided herein, it should be understood that the parameters may not exactly equal to the corresponding values, and may be approximate to the corresponding values within an allowable error tolerance or design constraint. Further, directional expressions such as "up", "down", "front", "back", "left", "right" or the like which are mentioned in the embodiments are merely directions with reference to the drawings. Therefore, the directional expressions are used to describe the protection scope of the present disclosure without limitation.

In the magnetometer body and the three-axis IM using the same of the present disclosure, disk-shape magnetic flux concentrators are fixed on two ends of the original elongated magnetic core to collect magnetic flux, which is equivalent to increasing a length-diameter ratio of a magnetic core, and crosstalk signals among three axes are prohibited by a signal compensation module, thereby achieving minimization of the three-axis IM on the premise of ensuring the accuracy.

Figure 1:
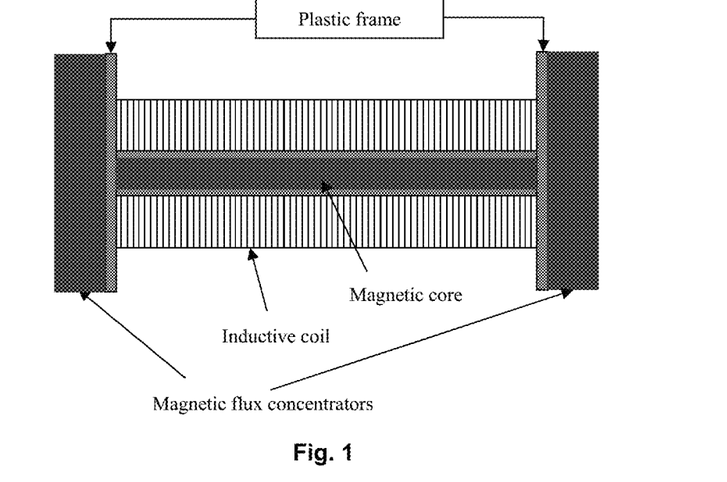
FIG. 1 is a longitudinal sectional diagram of a magnetometer body according to an embodiment of the present disclosure.

In an exemplary embodiment of the present disclosure, a magnetometer body is provided. FIG. 1 is a longitudinal sectional diagram of the magnetometer body according to the embodiment of the present disclosure. As shown in FIG. 1, a magnetic core structure with a section in a shape of a character "H" has an middle portion in a shape of an elongated rod with a length of 20 cm and a diameter of 1.0 cm, and two end portions in a disk shape with a length of 1.0 cm and a diameter of 10 cm. The three parts of the magnetic core structure are fixed together tightly.

In the magnetometer body of the present disclosure, the middle portion in a shape of an elongated rod is referred to as a magnetic core, and the two end portions in a shape of a flat cylinder are referred to as magnetic flux concentrators, which have the same material as that of the magnetic core. A ratio between a diameter of each of the magnetic flux concentrators and a diameter of the magnetic core is in a range of 2:1-10:1, and a ratio between the diameter of each of the magnetic flux concentrators and a length of the magnetic core is in a range of 1:1-1:5.

The magnetic core structure in the magnetometer body has a material of ferrite, and preferably, soft magnetic ferrite. This material has a high initial permeability, a low conductivity, and good plasticity, and can amplify the magnetic induction intensity without loss, thereby achieving the required sensitivity.

For a general magnetic core structure without a magnetic flux concentrator, due to a demagnetizing field, the magnetic core structure has an apparent permeability $\mu_{app}$ much smaller than an initial permeability of the material per se. For a rod-shaped magnetic core, a demagnetizing factor thereof is:

$$N = \frac{1}{m^2-1}\left\{\frac{m}{2(m^2-1)^{\frac{1}{2}}}\ln\left(\frac{m+(m^2-1)^{\frac{1}{2}}}{m-(m^2-1)^{\frac{1}{2}}}\right)-1\right\} \quad (1)$$

then the apparent permeability is:

$$\mu_{app} = \frac{\mu_r}{1+N(\mu_r-1)} \quad (2)$$

wherein m is a length-diameter ratio of the rod-shaped magnetic core, $$m = \frac{l}{d},$$

and $\mu_r$ is the initial permeability of the magnetic material.

After the magnetic flux concentrators with a diameter of D and a height of t are tightly fixed on two ends of a magnetic core in the magnetic core structure, the length-diameter ratio in equation (1) is $$m = \frac{l+2t}{D},$$

and the apparent permeability is:

$$\mu_{app} = \frac{\mu_r}{1+N\times\left(\frac{d}{D}\right)^2(\mu_r-1)} \quad (3)$$

The magnetic core structure is primarily achieved based on equations (1)-(3), and it can be determined according to calculation that for the magnetic core structure with magnetic flux concentrators, the apparent permeability $\mu_{app}$ of the magnetic core structure is significantly increased.

Figure 2:
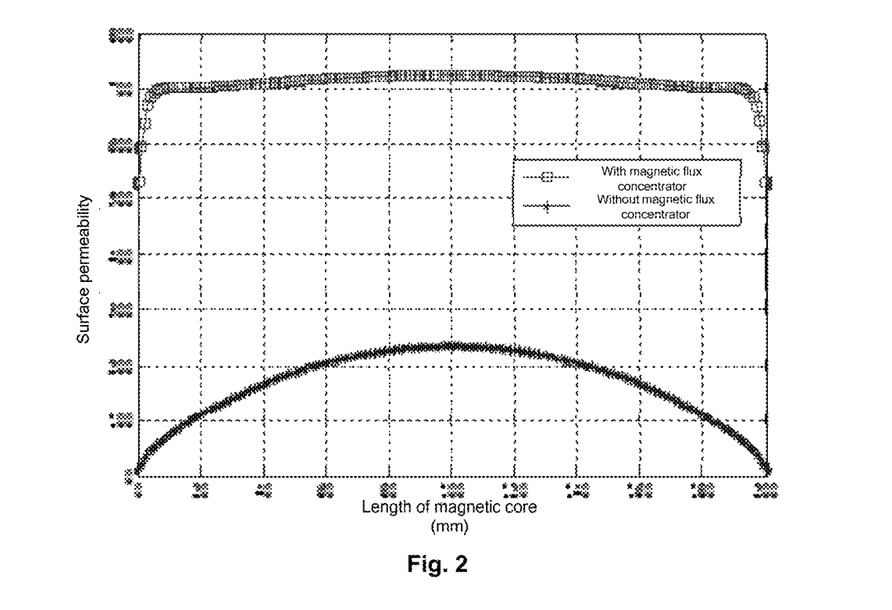
FIG. 2 is a diagram of comparison between magnetic fluxes of the magnetometer body illustrated in FIG. 1 and a conventional magnetometer which are obtained by simulation software.

FIG. 2 is a diagram of comparison between magnetic fluxes of the magnetometer body illustrated in FIG. 1 and a conventional magnetometer which are obtained by simulation software. As shown in FIG. 2, a magnetic core structure having a magnetic core and magnetic flux concentrators and a magnetic core structure having the same magnetic core without a magnetic flux concentrator have average apparent permeability of 709 and 168 respectively. Thus, the magnetic core structure in the magnetometer body according to the present embodiment achieves the same apparent permeability as that of a conventional magnetic core with a length of 1.2 m. Further, it can be seen from FIG. 2 that the magnetic flux concentrators not only increase the apparent permeability, but also enable a flatter distribution of the apparent permeability in the whole length range of the magnetic core, so that a longer magnetic core portion is available.

Engineering plastic is positioned on a perimeter of the magnetic core structure as a frame to support and protect the magnetic core structure, and a multi-turn coil is evenly wounded around the frame.

The multi-turn coil is achieved by using an oxygen-free copper enameled wire with a diameter in a range of 0.1 mm-0.42 mm. When the multi-turn coil is wounded, a first layer thereof is evenly wounded from left to right, and then a second layer thereof is evenly wounded from right to left, and so on. Each layer has 1000-8000 turns, and a total number of layers is in a range of 10-40, to achieve a total number of turns in a range of 10000-80000, thereby ensuring enough sensitivity.

Coil impedance is optimized together with parameters such as a noise level, input impedance or the like of subsequent circuits. Generally, a noise level of a circuit is constant. In this case, parameters such as a number of coil turns N, a wire diameter $d_w$, a winding tube diameter $d_{coil}$ are set as variables, and parameters such as the coil impedance $R_{sc}$, coil inductance $L_{pc}$, coil capacitance $C_{sc}$ or the like which are determined by the above variables as well as known parameters such as a magnetic core effective area S or the like are put into noise calculation equations for optimization. Assume that $e_{nw}$ is a circuit voltage noise, $i_{nw}$ is a circuit current noise, $K_b$=1.38×10$^{-23}$ is a Boltzmann constant, $T_c$ is an absolute temperature which is generally 300K, and $A_{core}$ is the magnetic core effective area.

An equivalent input magnetic field noise of an amplifier voltage noise is:

$$b_{nie}(f) = \frac{e_w}{|2\pi f \mu_{app} NS|} \quad (4)$$

An equivalent input magnetic field noise of an amplifier current noise is:

$$b_{iie}(f) = \frac{i_w \times |R_{sc} + j2\pi f L_{pc}|}{|j2\pi f \mu_{app} NS|} \quad (5)$$

an equivalent input magnetic field noise of a coil internal resistance thermal noise, comprising an enameled wire impedance and a magnetic core loss, is:

$$b_{rsce}(f) = \frac{\sqrt{4 K_b T_c R_{sc}}}{|j2\pi f \mu_{app} NS|} \quad (6)$$

Assuming that other small noises are ignored, a total equivalent input magnetic field noise of a magnetometer is:

$$b_{nte}(f) = \sqrt{b^2_{nie}(f) + b^2_{iie}(f) + b^2_{rsce}(f)} \quad (7)$$

The equation (7) is optimized, so that coil parameters for which the equivalent input magnetic field noise is minimal are optimal.

In the magnetometer body according to the present embodiment, with the magnetic flux concentrators, each magnetometer body with a short length can achieve the same permeability as that of a longer magnetic core, which is equivalent to increasing a length-diameter ratio of the magnetic core, i.e., achieving a high sensitivity within a small volume.

Specific shapes and sizes of several magnetometer bodies which are designed according to the present disclosure will be given below:

(1) A 1$^{st}$ magnetometer comprises: a magnetic core with a length of 100 mm and a diameter of 10 mm; magnetic flux concentrators with a length of 10 mm and a diameter of 60 mm, wherein a ratio between the diameter of each of the magnetic flux concentrators and the diameter of the magnetic core is 6:1, a ratio between the diameter of each of the magnetic flux concentrators and the length of the magnetic core is 3:5, and the whole magnetic core structure has a material of soft magnetic ferrite; and an enameled wire with a diameter of 0.1 mm, wherein a number of coil layers is 260, and each layer has 692 turns;

(2) A 2$^{nd}$ magnetometer comprises: a magnetic core with a length of 150 mm and a diameter of 10 mm; magnetic flux concentrators with a length of 12 mm and a diameter of 50 mm, wherein a ratio between the diameter of each of the magnetic flux concentrators and the diameter of the magnetic core is 5:1, a ratio between the diameter of each of the magnetic flux concentrators and the length of the magnetic core is 1:3, and the whole magnetic core structure has a material of soft magnetic ferrite; and an enameled wire with a diameter of 0.2 mm, wherein a number of coil layers is 90, and each layer has 608 turns;

(3) A 3$^{rd}$ magnetometer comprises: a magnetic core with a length of 220 mm and a diameter of 12 mm; magnetic flux concentrators with a length of 15 mm and a diameter of 96 mm, wherein a ratio between the diameter of each of the magnetic flux concentrators and the diameter of the magnetic core is 8:1, a ratio between the diameter of each of the magnetic flux concentrators and the length of the magnetic core is 24:55, and the whole magnetic core structure has a material of soft magnetic ferrite; and an enameled wire with a diameter of 0.3 mm, wherein a number of coil layers is 130, and each layer has 636 turns;

(4) A 4$^{th}$ magnetometer comprises: a magnetic core with a length of 36 mm and a diameter of 18 mm; magnetic flux concentrators with a length of 20 mm and a diameter of 36 mm, wherein a ratio between the diameter of each of the magnetic flux concentrators and the diameter of the magnetic core is 2:1, a ratio between the diameter of each of the magnetic flux concentrators and the length of the magnetic core is 1:1, and the whole magnetic core structure has a material of soft magnetic ferrite; and an enameled wire with a diameter of 0.32 mm, wherein a number of coil layers is 10, and each layer has 102 turns; and (5) A 5$^{th}$ magnetometer comprises: a magnetic core with a length of 1500 mm and a diameter of 30 mm; magnetic flux concentrators with a length of 30 mm and a diameter of 300 mm, wherein a ratio between the diameter of each of the magnetic flux concentrators and the diameter of the magnetic core is 10:1, a ratio between the diameter of each of the magnetic flux concentrators and the length of the magnetic core is 1:5, and the whole magnetic core structure has a material of soft magnetic ferrite; and an enameled wire with a diameter of 0.4 mm, wherein a number of coil layers is 10, and each layer has 3500 turns.

Figure 3:
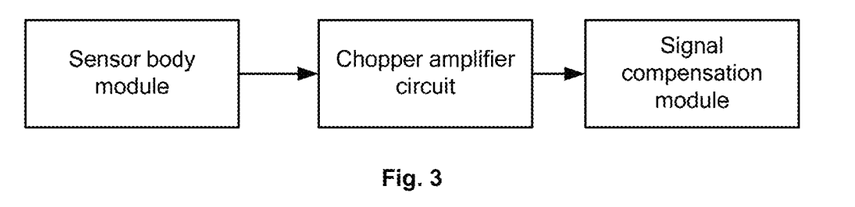
FIG. 3 is a structural diagram of a three-axis IM according to an embodiment of the present disclosure.

In another exemplary embodiment of the present disclosure, an three-axis IM is further provided based on the magnetometer body described above. FIG. 3 is a structural diagram of an three-axis IM according to an embodiment of the present disclosure.

As shown in FIG. 3, the three-axis IM according to the present embodiment comprises a magnetometer body module, three chopper amplifier circuits and a signal compensation module. The magnetometer body module comprises three magnetometer bodies described above, wherein directions of magnetic cores of any two of the three magnetometer bodies are perpendicular to each other. The three chopper amplifier circuits each have an input connected to two ends of an induction coil in a corresponding magnetometer body. The signal compensation module has a signal input connected to signal outputs of the three chopper amplifier circuits. A magnetic field to be measured generates inductive voltage signals respectively on the three magnetometer bodies. Signal amplitude of the three inductive voltage signals is enhanced through the respective chopper amplifier circuits, and information of a three-dimensional magnetic field is obtained after prohibiting crosstalk signals among three axes by the signal compensation module.

The constituent parts of the three-axis IM according to the present embodiment will be described below in detail respectively.

1. Sensor Body Module

Figure 4:
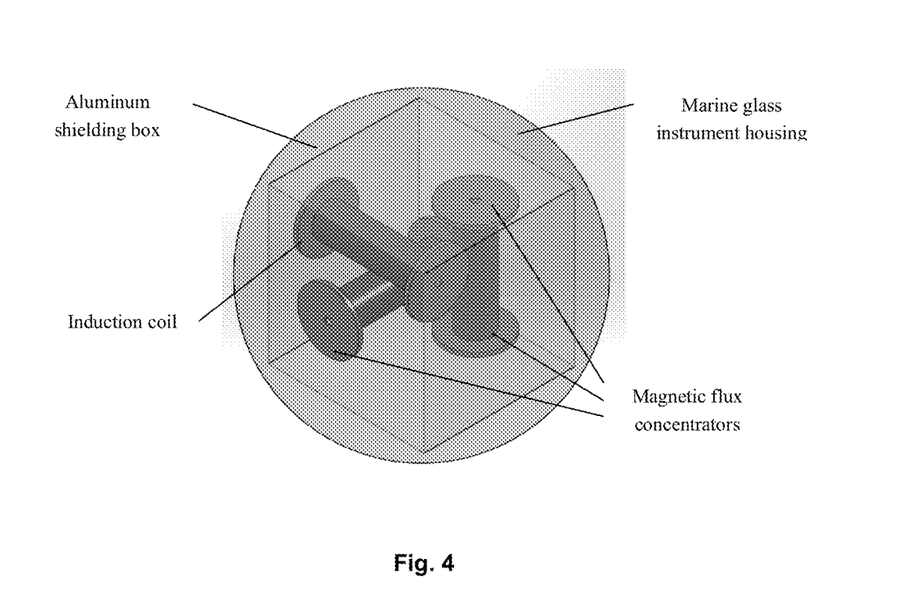
FIG. 4 is a structural diagram of a magnetometer body module in the three-axis IM illustrated in FIG. 3.

FIG. 4 is a diagram of a magnetometer body module in the three-axis IM illustrated in FIG. 3. As shown in FIG. 4, the sensor body module comprises three magnetometer bodies described above, wherein directions of magnetic cores of any two of the three magnetometer bodies are perpendicular to each other. The three magnetometer bodies have magnetic core structures in an x-axis direction, a y-axis direction, and a z-axis direction respectively. In order to not only avoid orthogonal crosstalk in the three-axis IM, but also shield an external electromagnetic interference, each magnetometer body is placed in an aluminum shielding box.

A total volume of the whole sensor body module does not exceed 23 cm*23 cm*23 cm, and may be directly integrated into a marine glass instrumentation housing with a diameter of 17 inches, to achieve submarine magnetic field measurement. Thus, the sensor body module satisfies requirements for light mass and small volume.

2. Chopper Amplifier Circuit

For the three-axis IM, in order to increase an output voltage, a IM in each axis is configured with a chopper amplifier circuit. That is, there are totally three chopper amplifier circuits. The three chopper amplifier circuits have the same structure, and one of them will be described by way of example.

Figure 5:
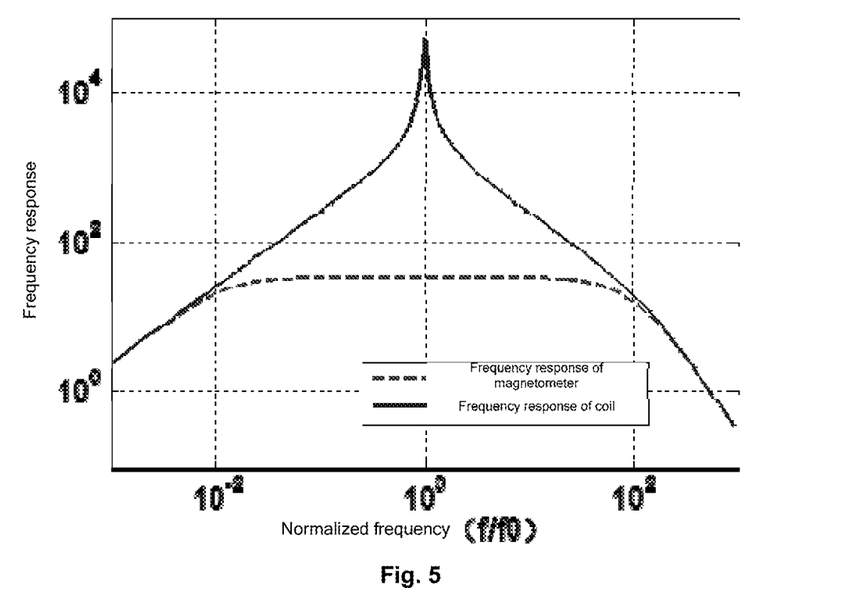
FIG. 5 is a curve of expanding a bandwidth of the three-axis IM illustrated in FIG. 3 by chopper amplifier circuits in the IM.

The chopper amplifier circuits each have a signal input connected to two ends of an induction coil in a corresponding magnetometer body in the sensor body module. The chopper amplifier circuit primarily achieves two functions. The first function is to expand a bandwidth. For a front-end induction coil of the three-axis IM, in order to achieve a high sensitivity, there may be a large number of coil turns, thereby resulting in a not too high resonant frequency of the coil, which may possibly be within a working bandwidth. The resonant peak may result in the magnetometer not working stably in the working bandwidth, thereby causing vibration. Therefore, the chopper amplifier circuit comprises a matching network and a current amplification module, both of which are used to expand the bandwidth of the magnetometer, as shown in FIG. 5. The second function is to reduce a 1/f noise. In the low-frequency amplification, due to the influence of the 1/f noise of electronics per se, a useful signal may be buried in the noise during direct amplification. Therefore, when a low-frequency magnetic field signal is amplified, it needs to overcome the influence of the 1/f noise to obtain beneficial amplification.

Figure 6:
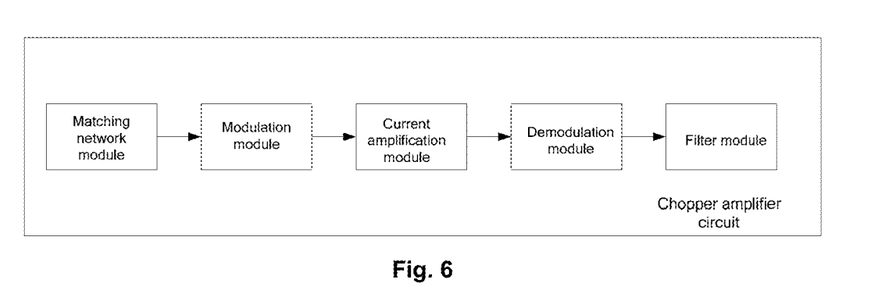
FIG. 6 is a structural diagram of a chopper amplifier circuit in the three-axis IM illustrated in FIG. 3.

As shown in FIG. 6, the chopper amplifier circuit is primarily comprised of five modules, including a matching network module, a modulation module, a current amplification module, a demodulation module, and a filter module. The matching network module is configured to compensate for an output resonant point of an induction coil to expand a working bandwidth of the induction coil. The modulation module is configured to modulate a signal output by the matching network module to a high frequency with a square signal at a preset frequency to generate a chopping signal. The current amplification module is configured to perform low-noise current amplification on the chopping signal output by the modulation module by using an operational amplifier or a pair transistor amplifier. The demodulation module is configured to demodulate a useful signal in the signal output by the current amplification module to a low frequency by using the same circuit structure as that of the modulation module, and modulate a 1/f noise introduced by the amplifier to a high frequency. The filter module is configured to filter out a high-frequency signal resulting from the modulating and demodulating processes to retain a useful magnetic field signal.

2.1 Matching Network Module

The matching network module is configured to compensate for an output resonant point of an induction coil to expand a working bandwidth of the coil.

Figure 7:
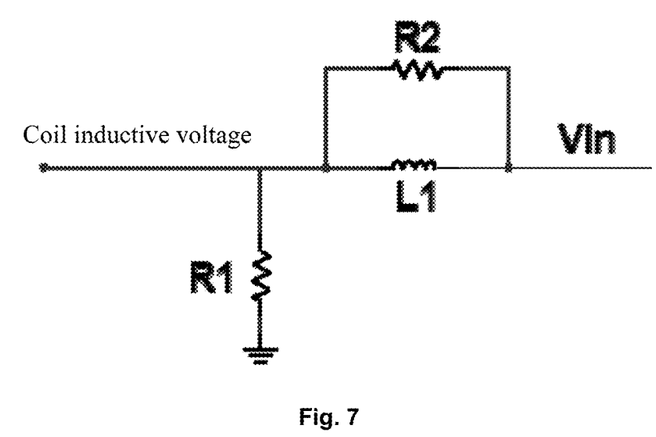
FIG. 7 is a circuit diagram of a matching network module in the chopper amplifier circuit illustrated in FIG. 6.

The matching network module is primarily achieved by using a series-parallel network of resistors, an inductor and capacitors. As shown in FIG. 7, an inductive signal output by the induction coil is connected in series to a signal ground via a $1^{st}$ resistor R1, and the inductive signal output by the induction coil is connected to a parallel circuit of a $2^{nd}$ resistor R2 and a $1^{st}$ inductor L1 to act as an output $V_{in}$ of the matching network module. Specifically, the matching network module comprises the $1^{st}$ resistor R1, having a $1^{st}$ end connected to an output of the induction coil of the magnetometer body and a $2^{nd}$ end connected to the signal ground; and the parallel circuit of the $2^{nd}$ resistor R2 and the $1^{st}$ inductor L1, having a $1^{st}$ end connected to the output of the induction coil of the magnetometer body and a $2^{nd}$ end acting as the output $V_{in}$ of the matching network module. The $1^{st}$ resistor R1 is 25.5 kΩ, the $2^{nd}$ resistor R2 is 10 kΩ, and the $1^{st}$ inductor L1 is 220 mH.

2.2 Modulation Module

Figure 8:
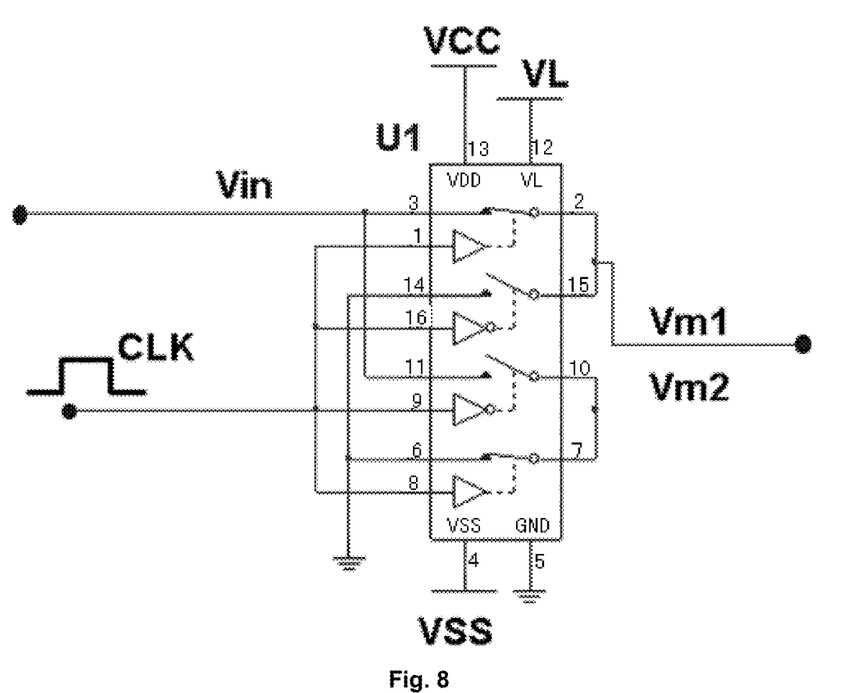
FIG. 8 is a circuit diagram of a modulation module in the chopper amplifier circuit illustrated in FIG. 6.

The modulation module is primarily achieved by using a CMOS analog switch chip ADG413 (U1), and is configured to modulate a signal output by the matching network module to a high frequency with a square signal at a preset frequency to generate a chopping signal.

As shown in FIG. 8, the U1 has pins 1, 8, 9 and 16 connected to a clock signal CLK, pins 3 and 11 connected to the output $V_{in}$ of the matching network module, pins 6 and 14 connected to a signal ground, a pin 12 connected to a logical voltage value VL, a pin 13 connected to a positive voltage VCC output by a power supply module, i.e., a supplied positive voltage, pins 2 and 15 connected to a signal output positive end, and pins 7 and 10 connected to a signal output negative end, wherein the signal output positive end and the signal output negative end are connected to inputs $V_{m1}$ and $V_{m2}$ of the current amplification module respectively.

2.3 Current Amplification Module

Figure 9:
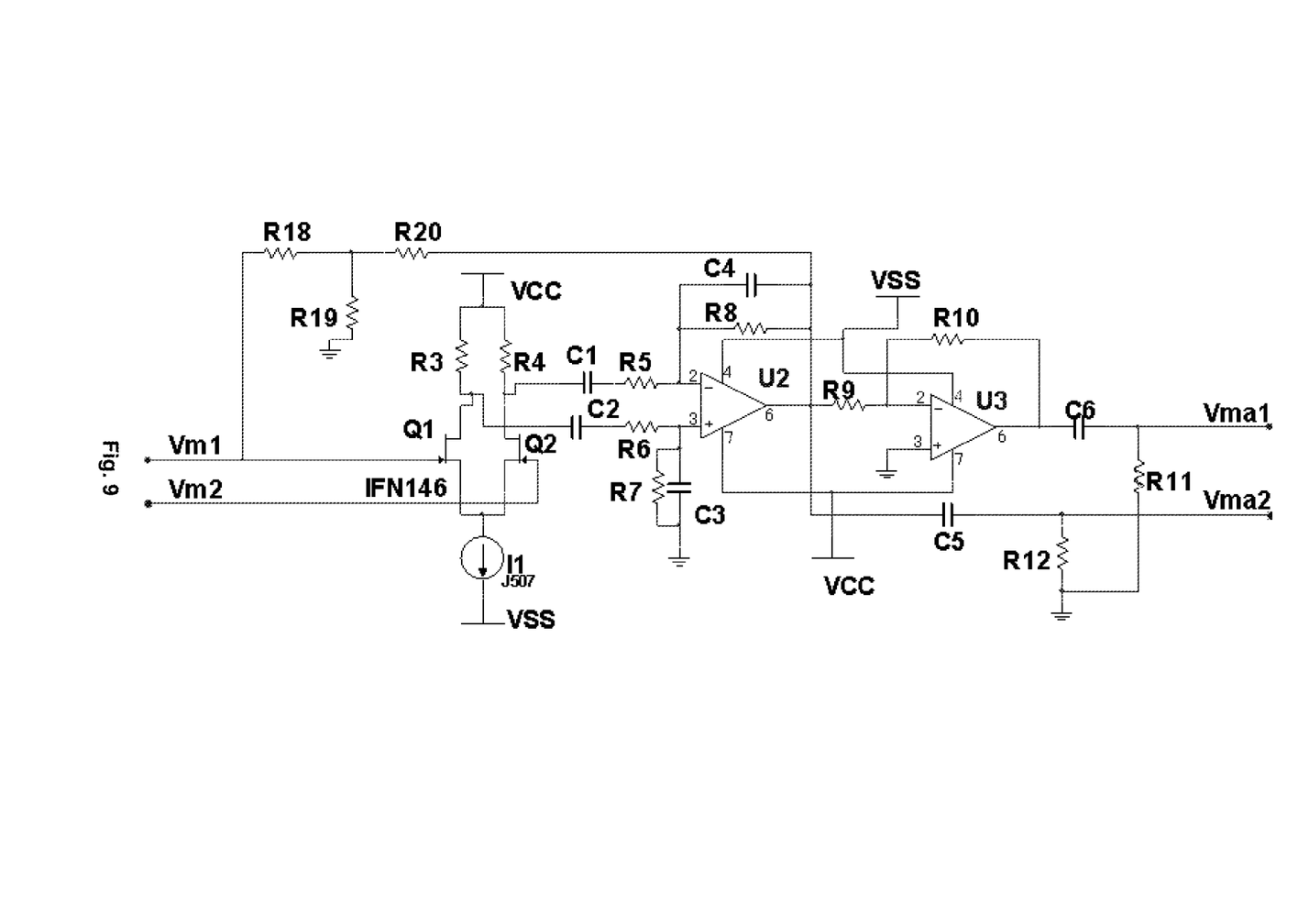
FIG. 9 is a circuit diagram of a current amplification module in the chopper amplifier circuit illustrated in FIG. 6.

As shown in FIG. 9, the current amplification module is divided into $1^{st}$, $2^{nd}$ and $3^{rd}$ amplifier circuits which are connected in series. The 1st amplifier circuit is configured for low-noise pre-amplification, and the 2nd amplifier circuit is configured for power amplification, wherein the 1st amplifier circuit is connected to the 2nd amplifier circuit as a whole in a negative feedback manner; and the 3rd amplifier circuit is configured for follower amplification, to achieve polarity reversal of an output voltage.

The 1st amplifier circuit is formed of a FET pair transistor comprising a 1st pair transistor Q1 and a 2nd pair transistor Q2, both of which have a model number of INF146. The Q1 and the Q2 have G electrodes connected to the outputs $V_{m1}$ and $V_{m2}$ of the modulation module respectively; S electrodes connected in short, wherein a common end of the S electrodes is connected to a positive voltage VSS output by a power supply module via a current source I1 which has a model number of J507; and D electrodes connected to the positive voltage VCC output by the power supply module via a 3rd resistor R3 and a 4th resistor R4 respectively, wherein the 3rd resistor R3 and the 4th resistor R4 are 3.0 kΩ, and the D electrodes of the Q1 and the Q2 act as outputs of the 1st amplifier circuit respectively.

The 2nd amplifier circuit is achieved by using an MAX4101ESA (U2). The U2 has a pin 2 connected to the D electrode of the Q2 in the 1st amplifier circuit via a 5th resistor R5 and a 1st capacitor C1 in turn. The U2 has a pin 3 connected to the D electrode of the Q1 in the 1st amplifier circuit via a 6th resistor R6 and a 2nd capacitor C2 in turn, wherein the 1st capacitor C1 has the same capacitance of 100 nF as that of the 2nd capacitor C2, and the 5th resistor R5 has the same resistance of 1 kΩ as that of the 6th resistor R6. The U2 has a pin 6 connected to the pin 2 via a parallel circuit of a 4th capacitor C4 and an 8th resistor R8, wherein the 4th capacitor C4 is 10 pF, and the 8th resistor R8 is 200 kΩ. The pin 3 of the U2 is connected to the signal ground via a parallel circuit of a 7th resistor R7 and a 3rd capacitor C3, wherein the 7th resistor R7 is 200 kΩ and the 3rd capacitor C3 is 10 pF. The pin 6 of the U2 is connected to the output $V_{m1}$ of the modulation module via a 20th resistor R20 and a 18th resistor R18 which are connected in series, wherein the 20th resistor R20 and the 18th resistor R18 are connected to the signal ground via a 19th resistor R19. The U2 has a pin 4 connected to the positive voltage VSS output by the power supply module. The U2 has a pin 7 connected to the positive voltage VCC output by the power supply module. The pin 6 of the U2 is connected to a 2nd output $V_{ma2}$ of the current amplification module as an output of the 2nd amplifier circuit, wherein the 2nd output $V_{ma2}$ of the current amplification module is connected to the signal ground via a 12th resistor R12. The 5th capacitor C5 is 100 nF, and the 12th resistor R12 is 1 kΩ.

The 3rd amplifier circuit is also achieved by using an MAX4101ESA (U3). The U3 has a pin 2 (input negative end) connected to the pin 6 of the U2 in the 2nd amplifier circuit via a 9th resistor R9. The U3 has a pin 3 (input positive end) connected to the signal ground. The 9th resistor R9 is 1 kΩ. The pin 2 of the U3 is connected to the pin 6 of the U2 via a 10th resistor R10 to form a series loop, wherein the 10th resistor R10 is 1 kΩ. The U3 has a pin 4 connected to the positive voltage VSS output by the power supply module. The U3 has a pin 7 connected to the positive voltage VCC output by the power supply module. The U3 has a pin 6 connected to a 1st output $V_{ma1}$ of the current amplification module via a 6th capacitor C6, and the 1st output $V_{ma1}$ of the current amplification module is connected to the signal ground via a 11th resistor R11. The 6th capacitor C6 is 100 nF, and the 11th resistor R11 is 1 kΩ.

2.4 Demodulation Module

Figure 10:
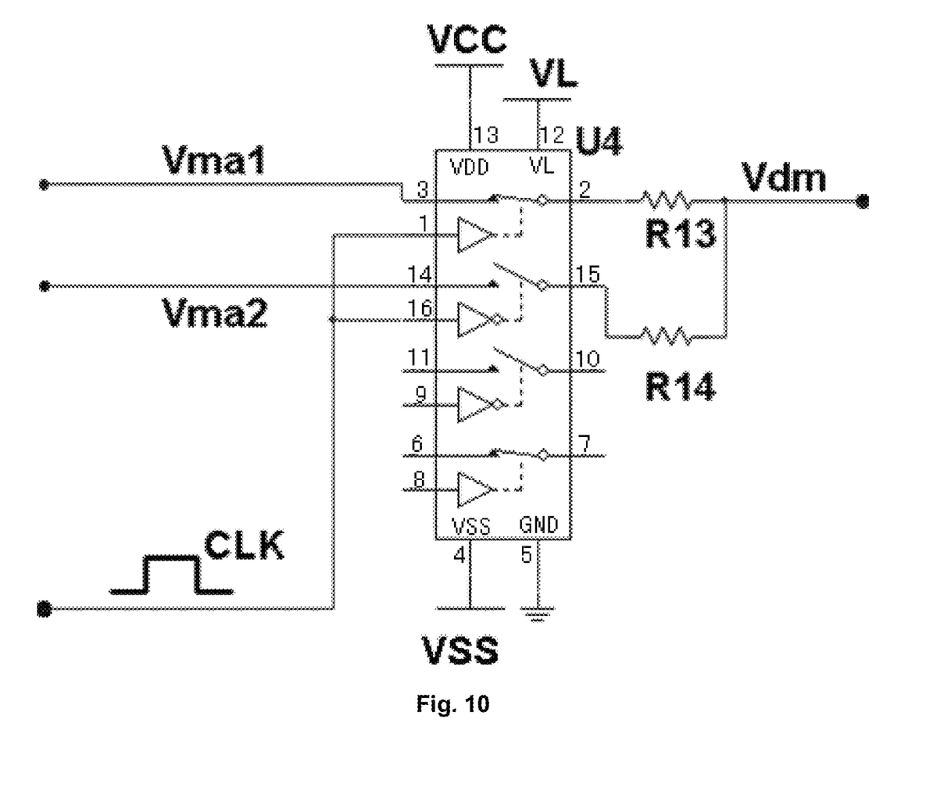
FIG. 10 is a circuit diagram of a demodulation module in the chopper amplifier circuit illustrated in FIG. 6.

As shown in FIG. 10, the demodulation module is symmetric to the modulation module, and is achieved by using an ADG413 (U4). The U4 has pins 3 and 14 connected to the 1st output $V_{ma1}$ and the 2nd output $V_{ma2}$ of the current amplification module respectively. The U4 has pins 1 and 16 which are connected to the clock signal CLK at the same time. The U4 has a pin 4 connected to the positive voltage VSS output by the power supply module. The U4 has a pin 5 connected to the signal ground. The U4 has a pin 12 connected to VL. The U4 has a pin 13 connected to the positive voltage VCC output by the power supply module. The U4 has pins 2 and 15 connected in series to a 13th resistor R13 and a 14th resistor R14 respectively and then connected in short to act as an output $V_{dm}$ of the demodulation module. The 13th resistor R13 and the 14th resistor R14 each are 1 kΩ.

2.5 Filter Module

Figure 11:
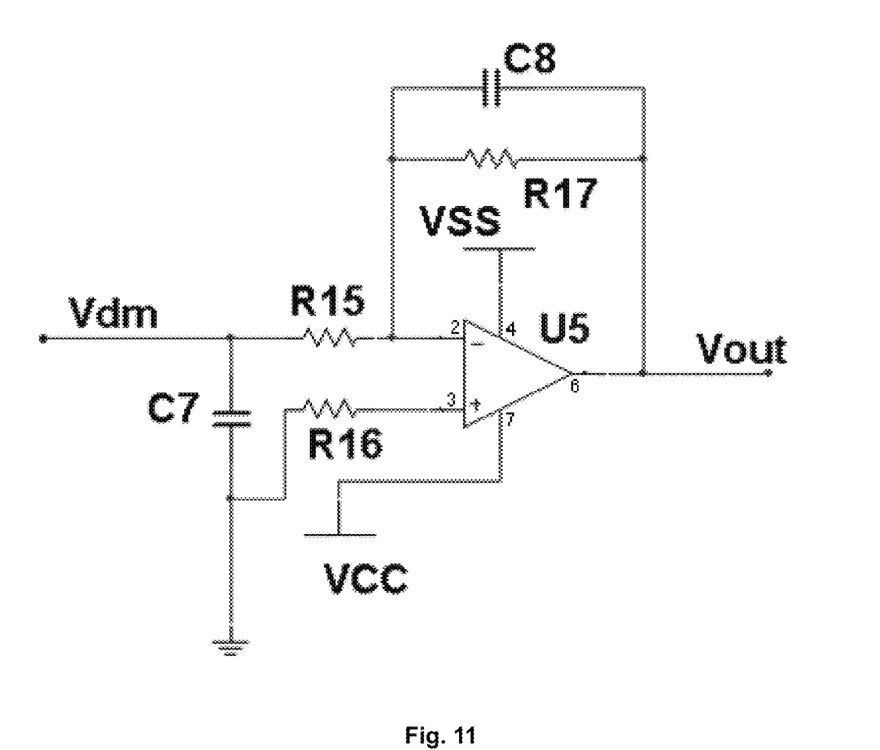
FIG. 11 is a circuit diagram of a filter module in the chopper amplifier circuit illustrated in FIG. 6.

As shown in FIG. 11, the filter module is achieved by using a chip MAX4101ESA (U5).

The output $V_{dm}$ of the demodulation module is connected to a pin 2 of the U5 (input negative end of the U5) via a 15th resistor R15. Further, the output $V_{dm}$ of the demodulation module is connected to the signal ground via a 7th capacitor C7. The 15th resistor R15 is 1 kΩ, and the C7 is 1 nF. The U5 has a pin 3 connected to the signal ground via a 16th resistor R16 as an input positive end. The 16th resistor R16 is 1 kΩ. The U5 has a pin 6 connected to the pin 2 via a parallel circuit of an 8th capacitor C8 and a 17th resistor R17. The 8th capacitor C8 is 4.7 nF, and the 17th resistor R17 is 200 kΩ. The U5 has a pin 7 connected to the positive voltage VCC output by the power supply module. The U5 has a pin 4 connected to the positive voltage VSS output by the power supply module. The U5 has a pin 6 connected to a signal output of the filter module which is a signal output $V_{out}$ of the chopper amplifier circuit.

Other modules such as the power supply module have an input of +/−6V direct voltage and an output of a voltage such as VCC, VSS, VL or the like which is provided to the chopper amplifier circuit. The clock signal CLK is achieved by a CPLD chip, with a repetition frequency of 3.5 kHz and amplitude of +/−5V. The details thereof will not be described here.

3. Signal Compensation Module

The signal compensation module is configured to compensate for signals output by the chopper amplifier circuits by the following equations to reduce crosstalk responses in the three-axis IM:

With the signal compensation module, voltage values output by the IM are:

$$V'_x = \frac{1}{(a-1)(2a-1)}\left[(1+a+2ab\, P_x/S_x)V_x - \frac{a+b}{P_y/P_x}\frac{P_y/S_y}{}V_y - \frac{a+b}{P_z/P_x}\frac{P_z/S_z}{}V_z\right]$$

$$V'_y = \frac{1}{(a-1)(2a-1)}\left[(1+a+2ab\, P_y/S_y)V_y - \frac{a+b}{P_x/P_y}\frac{P_x/S_x}{}V_y - \frac{a+b}{P_z/P_y}\frac{P_z/S_z}{}V_z\right]$$

$$V'_z = \frac{1}{(a-1)(2a-1)}\left[(1+a+2ab\, P_z/S_z)V_z - \frac{a+b}{P_x/P_y}\frac{P_x/S_x}{}V_x - \frac{a+b}{P_y/P_x}\frac{P_y/S_y}{}V_y\right]$$

wherein parameter a is a transverse crosstalk ratio of an inductive magnetic field in a range of 0-5%, parameter b is a transverse crosstalk ratio of a coil current magnetic field in a range of 0-10%, $P_x$, $P_y$, $P_z$ are frequency responses of the inductive magnetic field, $S_x$, $S_y$, $S_z$ are frequency responses of the coil current magnetic field, and $V_x$, $V_y$, $V_z$ are voltage values output by the IM without the signal compensation module.

Figure 12:
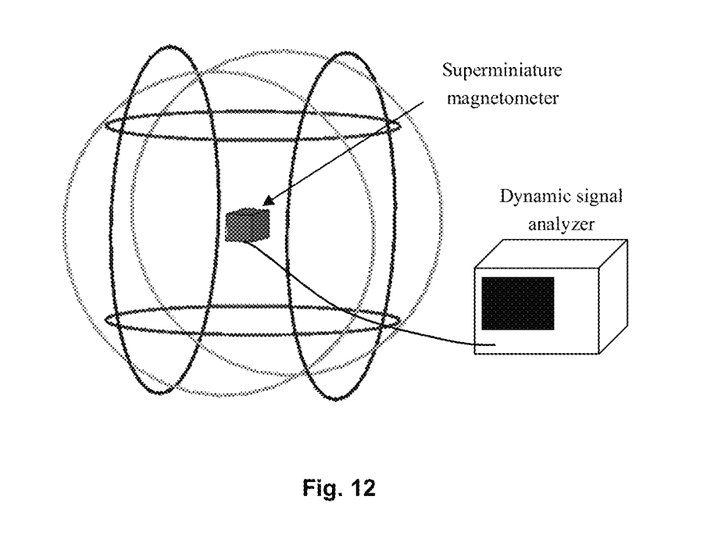
FIG. 12 is a diagram of a method for measuring a frequency response of an three-axis IM according to an embodiment of the present disclosure.

The principle of the signal compensation module will be described as follows. As shown in FIG. 12, a three-dimensional vector space with a uniform magnetic field is firstly generated by using three pairs of orthogonal Helmholtz coils. Directions of three axes of the three-axis magnetometer are fixed to be parallel to three directions of the Helmholtz coils by using a clamp. Assuming that the magnetometers in the three axes are completely consistent and absolutely symmetric, only measurement values in one of the three axes are needed to be used as references. Here, the Z direction will be described by way of example.

Firstly, Helmholtz coils in the Z direction generate a uniform magnetic field. Under the excitation of the magnetic field, the three-axis magnetometer outputs in all of the three directions, i.e., X, Y and Z directions, wherein a component in the Z direction is a main component, and outputs of the magnetometer in the X and Y directions are crosstalk signals, which are minor components. A ratio between a minor component and the main component is denoted as a transverse crosstalk ratio a of an inductive magnetic field. More strictly, the transverse crosstalk ratio a of the inductive magnetic field is, under the excitation of a magnetic field in a certain direction, a ratio between a magnetic field component output by any transverse component orthogonal to the magnetic field and the excitation component.

Next, the magnetometer in the Z direction is subjected to a current of certain magnitude, outputs caused in the X and Y directions by a magnetic field generated by the current are measured, and a ratio between an output and the current is denoted as b. More strictly, the transverse crosstalk ratio b of the coil current magnetic field is, in a case that coils in a certain direction are under the excitation of a current, a ratio between a current component output by any transverse component orthogonal to the current and the excitation component.

After measurement values of the crosstalk are obtained, compensation may be performed by using the following algorithm.

Assume that externally applied magnetic fields parallel to the x, y and z directions are $\Phi'_{xp}$, $\Phi'_{yp}$ and $\Phi'_{zp}$ respectively, and voltages sensed by the three-axis magnetometer without crosstalk are $V'_x$, $V'_y$, and $V'_z$ respectively, magnetic fields and voltages sensed by the three-axis magnetometer with crosstalk are $\Phi_x$, $\Phi_y$, $\Phi_z$ and $V_x$, $V_y$, $V_z$ respectively, and inductive magnetic fields generated by the current through the coils are $\Phi_{xs}$, $\Phi_{ys}$, $\Phi_{zs}$ respectively. In this case, the following magnetic field equations can be obtained:

$\Phi_x = \Phi'_{xp} + a(\Phi'_{yp} + \Phi'_{zp}) + b(\Phi'_{ys} + \Phi'_{zs})$ $\Phi_y = \Phi'_{yp} + a(\Phi'_{xp} + \Phi'_{zp}) + b(\Phi'_{xs} + \Phi'_{zs})$ $\Phi_z = \Phi'_{zp} + a(\Phi'_{yp} + \Phi'_{xp}) + b(\Phi'_{ys} + \Phi'_{xs})$ (12)

After the frequency responses $P_x$, $P_y$, $P_z$, $S_x$, $S_y$, $S_z$, the voltages $V'_x$, $V'_y$, and $V'_z$ sensed by the three-axis magnetometer without crosstalk and the voltages $V_x$, $V_y$, $V_z$ sensed by the three-axis magnetometer with crosstalk are put into the above equations, the following voltage equations can be obtained:

$$V_x = V'_x + a\left(\frac{V'_y}{P_y} + \frac{V'_z}{P_z}\right)P_x + b\left(\frac{V_y}{S_y} + \frac{V_z}{S_z}\right)P_x \quad (13)$$

$$V_y = V'_y + a\left(\frac{V'_x}{P_x} + \frac{V'_z}{P_z}\right)P_y + b\left(\frac{V_x}{S_x} + \frac{V_z}{S_z}\right)P_y$$

$$V_z = V'_z + a\left(\frac{V'_y}{P_y} + \frac{V'_x}{P_x}\right)P_z + b\left(\frac{V_y}{S_y} + \frac{V_x}{S_x}\right)P_z$$

After solving the above simultaneous equation system (13), the following equations can be obtained:

$$V'_x = \frac{1}{(a-1)(2a-1)}\left[(1+a+2ab\,P_x/S_x)V_x - \frac{a+b\,P_y/S_y}{P_y/P_x}V_y - \frac{a+b\,P_z/S_z}{P_z/P_x}V_z\right] \quad (14)$$

$$V'_y = \frac{1}{(a-1)(2a-1)}\left[(1+a+2ab\,P_y/S_y)V_y - \frac{a+b\,P_x/S_x}{P_x/P_y}V_y - \frac{a+b\,P_z/S_z}{P_z/P_y}V_z\right]$$

$$V'_z = \frac{1}{(a-1)(2a-1)}\left[(1+a+2ab\,P_z/S_z)V_z - \frac{a+b\,P_x/S_x}{P_x/P_y}V_x - \frac{a+b\,P_y/S_y}{P_y/P_x}V_y\right]$$

The above system of solutions is the compensation algorithm for the three-axis magnetometer, wherein parameters a, b, $P_x$, $P_y$, $P_z$, $S_x$, $S_y$, and $S_z$ are determined merely by the magnetometer per se, and may be measured by an instrument, without changing with an externally applied magnetic field. The crosstalk among three axes can be significantly reduced by adding the compensation algorithm in a final output and performing measurement and calculation using this method, thereby effectively improving the observation accuracy of the three-axis magnetic field.

It should be illustrated that the three-axis IM with the signal compensation module is merely a preferable embodiment of the present disclosure, which can output a signal more accurately reflecting the real condition of the magnetic field. In other embodiments of the present disclosure, the signal compensation module may also be omitted, without influencing the implementation of the present disclosure.

The three-axis IM according to the present embodiment achieves a reduced length in a range of 0.2 m-0.3 m with a reduction degree of about 75%, and a weight of less than 6 kg with a reduction degree of about 25%. Thereby, the three-axis IM may be integrated into a marine glass instrumentation housing for exploration with a length and a weight much smaller than those of the existing commercial products. The three-axis IM according to the present embodiment has technical indexes equivalent to those of the existing three-axis IMs with a length in a range of 1.0 m-1.4 m.

Until now, the present embodiment has been described in detail in conjunction with accompanying drawings. According to the above description, those skilled in the art should clearly understand the three-axis IM of the present disclosure.

Further, the above definitions of various elements and methods are not limited to various specific structures, shapes or manners mentioned in the implementations, which can be simply and routinely substituted by an ordinary person in the art. In an example, (1) The ferrite magnetic core may also be substituted with other soft magnetic material; and (2) The current amplification module may also be substituted with a negative feedback module.

In conclusion, in the magnetometer body and the three-axis IM using the same of the present disclosure, disk-shape magnetic flux concentrators are fixed on two ends of the original elongated magnetic core to collect magnetic flux, which is equivalent to increasing a length-diameter ratio of the magnetic core, thereby breaking through a noise limit of a conventional three-axis IM in a limited space. Further, crosstalk signals among signals in three axes are minimized and the length and weight are decreased to be much smaller than those of the existing commercial products by compensation using experimental measurements and the algorithm, thereby reducing the volume, weight and cost of the marine electromagnetic explorer, and achieving minimization of the three-axis IM.

The specific embodiments described above are used to further describe the purpose, technical solutions and beneficial effects of the present disclosure in detail. It should be understood that the above description is merely specific embodiments of the present disclosure, instead of limiting the present disclosure. Any amendment, equivalent substitution, improvement or the like made within the spirit and principle of the present disclosure should be included in the protection scope of the present disclosure.

We claim:

1. A three-axis Induction Magnetometer (IM), comprising:
a sensor body module comprising three magnetometer bodies, wherein directions of magnetic cores of any two of the three magnetometer bodies are perpendicular to each other, and each of the magnetometer bodies comprises: a magnetic core structure with an H-shaped longitudinal section, having an middle portion being an elongated rod-shaped magnetic core, and two end portions being disk-shape magnetic flux concentrators; and an induction coil evenly wounded around a perimeter of the middle portion of the magnetic core structure; and
three chopper amplifier circuits each having an input connected to two ends of an induction coil in a corresponding magnetometer body to enhance amplitude of a signal output by the induction coil in through chopper amplification,
wherein each of the chopper amplifier circuits comprises:
a matching network module configured to compensate for an output resonant point of an induction coil to eliminate a resonant peak and smooth impedance at the resonant point;
a modulation module connected to the matching network module and configured to modulate a signal output by the matching network module to a high frequency with a square signal at a preset frequency to generate a chopping signal;
a current amplification module connected to the modulation module and configured to perform low-noise current amplification on the chopping signal output by the modulation module by using an operational amplifier or a pair transistor amplifier;
a demodulation module connected to the current amplification module and configured to demodulate a useful signal in the signal output by the current amplification module to a low frequency, and modulate a 1/f noise introduced by the operational amplifier or the pair transistor amplifier in the current amplification module to a high frequency; and
a filter module configured to filter out a high-frequency signal resulting from the modulating and demodulating processes to retain a useful magnetic field signal.

2. The three-axis IM according to claim 1, wherein in the magnetic core structure, the magnetic core is in a shape of an elongated cylinder, and the magnetic flux concentrators are in a shape of a flat cylinder.

3. The three-axis IM according to claim 2, wherein in the magnetic core structure, a ratio between a diameter of each of the magnetic flux concentrators and a diameter of the magnetic core is in a range of 2:1-10:1, and a ratio between the diameter of each of the magnetic flux concentrators and a length of the magnetic core is in a range of 1:1-1:5.

4. The three-axis IM according to claim 1, further comprising:
a frame positioned on the perimeter of the magnetic core and inside the magnetic flux concentrators in the magnetic core structure, wherein the induction coil is wounded around the frame on the perimeter of the magnetic core in the magnetic core structure.

5. The three-axis IM according to claim 1, wherein the magnetic core structure has a material of soft magnetic ferrite.

6. The three-axis IM according to claim 1, wherein the matching network module comprises:
a first resistor (R1) having a first end connected to an output of the induction coil of the magnetometer body and a second end connected to a signal ground; and
a parallel circuit of a second resistor (R2) and a first inductor (L1), having a first end connected to the output of the induction coil of the magnetometer body and a second end acting as an output $V_{in}$ of the matching network module.

7. The three-axis IM according to claim 1, wherein,
the modulation module is achieved by using a first CMOS analog switch chip (U1), the modulation module having one or more logic control input terminals connected to a clock signal CLK, one or more first source terminals connected to the output $V_{in}$ of the matching network module, one or more second source terminals connected to the signal ground, a logic power supply terminal connected to a logical voltage value VL, a positive power supply potential terminal connected to a positive voltage VCC output by a power supply module, one or more first drain terminals connected to a signal output positive end, and one or more second drain terminals connected to a signal output negative end, wherein the signal output positive end and the signal output negative end are connected to inputs $V_{m1}$ and $V_{m2}$ of the current amplification module respectively; and
the demodulation module is symmetric to the modulation module, and is achieved by using a second CMOS analog switch chip (U4), the demodulation module having one or more first source terminals connected to a first output $V_{ma1}$ and a second output $V_{ma2}$ of the current amplification module respectively, one or more logic control inputer terminals connected to the clock signal CLK at the same time, a negative supply voltage terminal connected to a negative voltage VSS output by the power supply module, a ground terminal connected to the signal ground, a logic power supply terminal connected to VL, a positive supply voltage terminal connected to the positive voltage VCC output by the power supply module, one or more first drain terminals connected in series to a thirteenth resistor (R13) and a fourteenth resistor (R14) respectively and then are connected in short to act as an output $V_{dm}$ of the demodulation module.

8. The three-axis IM according to claim 1, wherein an output $V_{dm}$ of the demodulation module is connected to a signal ground via a seventh capacitor (C7), and the filter module is achieved by using an amplifier circuit (U5), the filter module having a positive input terminal connected to the signal ground via a sixteenth resistor (R16), a negative input terminal connected to the output $V_{dm}$ of the demodulation module via a fifteenth resistor (R15), an output terminal connected to the negative input terminal via a parallel circuit of an eighth capacitor (C8) and a seventeenth resistor (R17), a positive supply voltage terminal connected to a positive voltage VCC output by a power supply module, and a negative supply voltage terminal connected to a negative voltage VSS output by the power supply module, wherein the output terminal is connected to an output of the filter module which is a signal output $V_{out}$ of the chopper amplifier circuit.

9. The three-axis IM according to claim 1, wherein the current amplification module is divided into first, second and third amplifier circuits which are connected in series, wherein, the first amplifier circuit is formed of a FET pair transistor comprising a first pair transistor (Q1) and a second pair transistor (Q2), the first pair transistor (Q1) and the second pair transistor (Q2) having G electrodes connected to outputs $V_{m1}$ and $V_{m2}$ of the modulation module respectively, S electrodes connected in short and then connected to a positive voltage VSS output by a power supply module via a current source I1, and D electrodes connected to a positive voltage VCC output by the power supply module via a third resistor (R3) and a fourth resistor (R4) respectively, wherein the D electrodes of the first pair transistor (Q1) and the second pair transistor (Q2) act as outputs of the first amplifier circuit respectively;

the second amplifier circuit is achieved by using a second amplifier circuit (U2) having a negative input terminal connected to the D electrode of the second pair transistor (Q2) in the first amplifier circuit via a fifth resistor (R5) and a first capacitor (C1) in turn, a positive input terminal connected to the D electrode of the first pair transistor (Q1) in the first amplifier circuit via a sixth resistor (R6) and a second capacitor (C2) in turn, an output terminal connected to the negative input terminal via a parallel circuit of a fourth capacitor (C4) and an eighth resistor (R8), wherein the positive input terminal is connected to a signal ground via a parallel circuit of a seventh resistor (R7) and a third capacitor (C3), and the output terminal is connected to the output $V_{m1}$ of the modulation module via a twentieth resistor (R20) and an eighteenth resistor (R18) which are connected in series, wherein the eighteenth resistor (R18) and the twentieth resistor (R20) are connected to the signal ground via a nineteenth resistor (R19), a negative supply voltage terminal connected to the negative voltage VSS output by the power supply module, and a positive supply voltage terminal connected to the positive voltage VCC output by the power supply module, wherein the output terminal is connected to a second output $V_{ma2}$ of the current amplification module via a fifth capacitor (C5) as an output of the second amplifier circuit, and the second output $V_{ma2}$ of the current amplification module is connected to the signal ground via a 12th resistor (R12); and the third amplifier circuit (U3) having a negative input terminal connected to the output terminal of the $2^{nd}$ amplifier circuit via a ninth resistor (R9) as an input negative end, wherein the negative input terminal and the output terminal of the U2 are connected via a tenth resistor (R10) to form a series loop, a positive input terminal connected to the signal ground as an input positive end, a negative supply voltage terminal connected to the negative voltage VSS output by the power supply module, a positive supply voltage terminal connected to the positive voltage VCC output by the power supply module, and an output terminal connected to a first output $V_{ma1}$ of the current amplification module via a sixth capacitor (C6), wherein the first output $V_{ma1}$ of the current amplification module is connected to the ground via an eleventh resistor (R11).

10. The three-axis IM according to claim 1, further comprising:

a signal compensation module configured to compensate for signals output by the chopper amplifier circuits by the following equations to reduce crosstalk responses in the three-axis magnetometer:

$$V'_x = \frac{1}{(a-1)(2a-1)}\left[(1+a+2ab\ P_x/S_x)V_x - \frac{a+b\ P_y/S_y}{P_y/P_x}V_y - \frac{a+b\ P_z/S_z}{P_z/P_x}V_z\right]$$

$$V'_y = \frac{1}{(a-1)(2a-1)}\left[(1+a+2ab\ P_y/S_y)V_y - \frac{a+b\ P_x/S_x}{P_x/P_y}V_x - \frac{a+b\ P_z/S_z}{P_z/P_y}V_z\right]$$

$$V'_z = \frac{1}{(a-1)(2a-1)}\left[(1+a+2ab\ P_z/S_z)V_z - \frac{a+b\ P_x/S_x}{P_x/P_y}V_x - \frac{a+b\ P_y/S_y}{P_y/P_x}V_y\right]$$

wherein parameter a is a transverse crosstalk ratio of an inductive magnetic field, parameter b is a transverse crosstalk ratio of a coil current magnetic field, $P_x$, $P_y$, $P_z$ are frequency responses of the inductive magnetic field, $S_x$, $S_y$, $S_z$ are frequency responses of the coil current magnetic field, $V_x$, $V_y$, $V_z$ are voltage values output by the three chopper amplifier circuits without the signal compensation module, and $V'_x$, $V'_y$, $V'^z$ are voltage values output with the signal compensation module.

11. The three-axis IM according to claim 10, wherein a value of a is in a range of 0-5%, and a value of b is in a range of 0-10%.

* * * * *